United States Patent
Brammer et al.

(10) Patent No.: US 11,691,111 B2
(45) Date of Patent: Jul. 4, 2023

(54) SYSTEMS AND METHODS FOR GENERATING A DISSOLVED AMMONIA SOLUTION WITH REDUCED DISSOLVED CARRIER GAS AND OXYGEN CONTENT

(71) Applicant: MKS Instruments, Inc., Andover, MA (US)

(72) Inventors: Ulrich Alfred Brammer, Berlin (DE); Johannes Seiwert, Berlin (DE); Christiane Le Tiec, Berlin (DE)

(73) Assignee: MKS Instruments, Inc., Andover, MA (US)

( * ) Notice: Subject to any disclaimer, the term of this patent is extended or adjusted under 35 U.S.C. 154(b) by 347 days.

(21) Appl. No.: 16/842,515

(22) Filed: Apr. 7, 2020

(65) Prior Publication Data
US 2020/0316536 A1 Oct. 8, 2020

Related U.S. Application Data

(60) Provisional application No. 62/831,138, filed on Apr. 8, 2019.

(51) Int. Cl.
*B01D 19/00* (2006.01)
*B01F 23/23* (2022.01)
(Continued)

(52) U.S. Cl.
CPC .......... *B01F 23/2322* (2022.01); *B01D 19/00* (2013.01); *B01D 19/0005* (2013.01);
(Continued)

(58) Field of Classification Search
CPC ...... B01F 23/23; B01D 19/00; B01D 19/0005
See application file for complete search history.

(56) References Cited

U.S. PATENT DOCUMENTS

| 5,415,191 A | 5/1995 | Mashimo et al. |
| 6,001,223 A | 12/1999 | Hoffman et al. |

(Continued)

FOREIGN PATENT DOCUMENTS

| CN | 1297385 A | 5/2001 |
| CN | 102036742 A | 4/2011 |

(Continued)

OTHER PUBLICATIONS

European Search Report for European Patent Application No. 17869604.3, dated Mar. 11, 2020, 8 pages.

*Primary Examiner* — Robert A Hopkins
(74) *Attorney, Agent, or Firm* — Cesari and McKenna, LLP

(57) ABSTRACT

Systems and methods are described for supplying a rinsing liquid including ultrapure water and an ammonia gas. The system includes an ultrapure water source and a gas mixture source in fluid communication with a contactor. The gas mixture includes ammonia gas and a carrier gas. The system includes a control unit configured to adjust a flow rate of the ultrapure water source such that an operational pressure of the contactor remains below a pressure threshold. The system includes a compressor configured to remove a residual transfer gas out of the contactor. The contactor generates a rinsing liquid having ultrapure water and a concentration of the ammonia gas dissolved therein. The system includes a pump in fluid communication between the contactor and an outlet. The pump is configured to deliver the rinsing liquid having a gaseous partial pressure below the pressure threshold at the outlet.

20 Claims, 9 Drawing Sheets

(51) Int. Cl.
*B01F 23/232* (2022.01)
*B01F 23/80* (2022.01)
*B01F 35/21* (2022.01)
*B01F 35/221* (2022.01)
*B01F 35/75* (2022.01)
B01F 23/237 (2022.01)
B01F 101/58 (2022.01)

(52) U.S. Cl.
CPC ..... *B01D 19/0031* (2013.01); *B01D 19/0068* (2013.01); *B01F 23/23* (2022.01); *B01F 23/803* (2022.01); *B01F 35/2113* (2022.01); *B01F 35/2213* (2022.01); *B01F 35/2217* (2022.01); *B01F 35/7544* (2022.01); *B01F 23/2376* (2022.01); *B01F 2101/58* (2022.01)

(56) References Cited

U.S. PATENT DOCUMENTS

| | | | |
|---|---|---|---|
| 6,884,359 | B2 | 4/2005 | Kambe et al. |
| 7,731,161 | B2 | 6/2010 | Seiwert et al. |
| 8,448,925 | B2 | 5/2013 | Seiwert et al. |
| 2002/0063345 | A1 | 5/2002 | Kambe et al. |
| 2005/0019244 | A1 | 1/2005 | Spiegelman et al. |
| 2005/0133066 | A1 | 6/2005 | Takahashi |
| 2005/0161059 | A1 | 7/2005 | Franklin et al. |
| 2014/0357734 | A1 | 12/2014 | Xia et al. |
| 2015/0314247 | A1 | 11/2015 | Milligan et al. |
| 2016/0064257 | A1 | 3/2016 | Nonaka et al. |
| 2018/0133665 | A1 | 5/2018 | Brammer et al. |

FOREIGN PATENT DOCUMENTS

| | | | | |
|---|---|---|---|---|
| CN | 104923504 | A * | 9/2015 | |
| CN | 207877300 | U | 9/2018 | |
| EP | 1512457 | A1 | 3/2005 | |
| EP | 1654192 | B1 * | 11/2006 | ........... C01B 21/045 |
| JP | 2003062403 | A * | 3/2003 | |
| JP | 2004273799 | A | 9/2004 | |
| JP | 2012-223725 | A | 11/2012 | |
| JP | 2016076589 | A | 5/2016 | |
| JP | 2017192898 | A | 10/2017 | |
| JP | 6617071 | B2 * | 12/2019 | |

* cited by examiner

SYSTEMS AND METHODS FOR GENERATING A DISSOLVED AMMONIA SOLUTION WITH REDUCED DISSOLVED CARRIER GAS AND OXYGEN CONTENT

CROSS-REFERENCE TO RELATED APPLICATION

This application claims the benefit of U.S. Provisional Application No. 62/831,138, filed Apr. 8, 2019, which is incorporated by reference herein in its entirety.

TECHNICAL FIELD

This application relates generally to systems and methods employed in wet cleaning operations during fabrication of semiconductor devices. In particular, this application relates to systems and methods for generating and delivering deionized water with a desired concentration of $NH_3$ for use in semiconductor fabrication processes.

BACKGROUND

The processing of wafers, lithography masks, flat panels and solar panels involves wet processing with different chemicals. These chemicals must be rinsed away before the handled wafer or panel can be dried. Deionized water ("DI-water") and ultrapure water (used interchangeably herein) are commonly used in semiconductor device fabrication processes for rinsing or wet cleaning operations.

However, use of a substantially non-conductive liquid such as DI-water in semiconductor fabrication processes can contribute to a buildup of charge on the surface of the wafer. This is especially a problem in fabrication processes utilizing spinning wafer tools, as electro-osmotic effects produced by the contact between the wafer and the DI water used for cleaning operations can lead to charge buildup and eventual electrostatic discharge events. These discharge events can damage or even destroy structures on the wafer, or cause contaminants or undesirable particles to attach to the wafer. Accordingly, to avoid the development of electrostatic charges during the rinsing process, it is desirable to use a rinsing liquid with a higher electrical conductivity than ultrapure water.

Existing systems often use a conductive cleaning liquid to reduce charge buildup on the wafer during wet cleaning operations. For example, a gas such as carbon dioxide ("CO2") can be dissolved in the DI-water to produce carbonated deionized ("DI-CO2") water. However, the acidity of DI-CO2 water can undesirably etch away acid-sensitive materials such as copper, cobalt and other metals which are commonly used in the back end of line ("BEOL") stage of wafer fabrication.

Another approach uses ammonia ("NH3") instead of CO2. For example, a dilute solution of NH3 in DI-water is commonly used for wafers or panels with exposed metal layers. By dissolving NH3 in DI-water, an alkaline solution with substantially lower etch rates than DI-CO2 can be produced for use in wet cleaning operations.

However, the processing machines (e.g., single wafer spin tools) typically rinse each wafer in a separate chamber, and a fabrication facility may operate several processing machines independently despite each machine being connected to a common source for resources used during fabrication such as a DI-water supply for wafer rinsing. Further, the processes in each chamber are seldom synchronized resulting in a randomly-varying demand for the rinsing liquid.

Supplying a freshly-prepared conductive rinsing liquid with a precise amount of NH3 dissolved therein can pose a technical challenge that is only compounded given the randomly-varying flow rate needed to service unsynchronized processing tools. For example, NH3 can be supplied as a concentrated solution or as a gas. Due to the high solubility of NH3 in DI-water, use of NH3 in its gas phase results in a total absorption of the NH3 into the DI-water. However, NH3 gas is so reactive with DI-water that there is a high risk the DI-water will flow back into the NH3 gas supply line and into the NH3 valves when the flow rate of NH3 is sufficiently low. This can lead to serious control problems, as the flow characteristics of a valve are vastly different between a gas-filled valve and the same valve filled with water. It is therefore difficult to maintain a stable flow of NH3 gas into DI-water under such conditions, especially when the gas flow is interrupted in the normal course of the fabrication process. It can be even more difficult to produce a rinsing liquid for which small, yet precise amounts of ammonia gas are dissolved in the DI-water.

U.S. patent application Ser. No. 15/808,471, which is hereby incorporated by reference in its entirety, discloses an apparatus for generating and delivering a conductive cleaning liquid comprising DI-water with a desired concentration of NH3 dissolved therein to prevent charge buildup on a wafer surface when used for semiconductor fabrication processes such as wet cleaning operations. In order to address the above-described challenges posed by NH3's absorption into DI-water, a carrier gas like nitrogen can be used to facilitate the dissolution process. The resulting rinsing liquid has a partial pressure due to the carrier gas that is equal or greater than the atmospheric pressure.

This gaseous partial pressure is a problem for certain applications. Bubbles can be generated at the moment when the rinsing liquid is applied to the wafer surface due to a pressure drop attributable to the supply nozzle. These bubbles can attach to the wafer surface and cause damages to the structures formed thereon. Another problem can result from dissolved oxygen in the rinsing liquid which can corrode metal structures formed on the wafer.

SUMMARY

In light of the foregoing, there is an ongoing need for systems and methods for generating and delivering a rinsing liquid comprising DI-water with a desired concentration of NH3 dissolved therein with a gaseous partial pressure below the atmospheric pressure. Further, there is a need for systems and methods for reducing and/or removing dissolved oxygen from rinsing liquids. The technology described herein allows for precise control over the gaseous partial pressure by controlling the carrier gas flow. Further, the concepts described herein provide for an oxygen reduction system that reduces the oxygen content in the rinsing liquid while mitigating any ammonia stripping.

The technology, in one aspect, features a system for supplying a rinsing liquid including ultrapure water and an ammonia gas. The system includes an ultrapure water source in fluid communication with a contactor. The ultrapure water source is configured to supply ultrapure water to the contactor. The system further includes a gas mixing source in fluid communication with the contactor. The gas mixture source is configured to supply the ammonia gas and a carrier gas to the contactor. The system further includes a control unit in fluid communication with the contactor. The control unit is configured to adjust a flow rate of the ultrapure water such that an operational pressure of the contactor remains below a pressure threshold. The system further includes a compressor in fluid communication with the contactor. The compressor is configured to remove a residual transfer gas out of the contactor. The contactor is configured to generate a rinsing liquid having ultrapure water and a concentration of the ammonia gas dissolved therein. The system further includes a pump in fluid communication between the contactor and an outlet. The pump is configured to deliver the rinsing liquid having a gaseous partial pressure below the pressure threshold at the outlet.

The technology can further include any of the following features. In some embodiments, the control unit is configured to adjust the flow rate of the ultrapure water at an inlet of the contactor, in order to control the operational pressure of the contactor.

In some embodiments, the liquid level of the contactor is controlled by adjusting a flow rate of the carrier gas.

In some embodiments, the liquid level of the contactor is controlled by adjusting a flow rate of the residual transfer gas.

In some embodiments, the operational pressure of the contactor ranges from about 0.4 to about 0.95 bar absolute. For example, in some embodiments, the operational pressure of the contactor is about 0.6 bar absolute.

In some embodiments, the pressure threshold is about atmospheric pressure.

In some embodiments, the rinsing liquid is delivered to a wafer. For example, in some embodiments, the system further includes a nozzle in fluid communication to the outlet. The nozzle can be configured to deliver the rinsing liquid to the wafer.

In some embodiments, the system further includes a membrane contactor in fluid communication with the outlet. For example, in some embodiments, the membrane contactor can be configured to strip oxygen from the rinsing liquid.

In some embodiments, the system further includes a pressure sensor in fluid communication with the contactor. For example, in some embodiments, the pressure sensor can be configured to monitor the operational pressure of the contactor.

In some embodiments, the gas mixture source includes an ammonia gas source and a carrier gas source. For example, in some embodiments, the ammonia gas source is configured to supply the ammonia gas to the contactor. In some embodiments, the carrier gas source is configured to supply the carrier gas to the contactor.

In some embodiments, the ultrapure water, the ammonia gas, and the carrier gas are mixed prior to entering the contactor.

In some embodiments, the contactor is a packed column or packed tower type contactor.

The technology, in another aspect, features a method for supplying a rinsing liquid including ultrapure water with a desired concentration of an ammonia gas dissolved therein having a gaseous partial pressure below atmospheric pressure. The method includes supplying ultrapure water and a gas mixture to a contactor. The gas mixture includes ammonia gas and a carrier gas. The method further includes monitoring an operational pressure of the contactor using a pressure sensor in fluid communication with the contactor. The method also includes generating a rinsing liquid within the contactor. The rinsing liquid includes ultrapure water and a concentration of the ammonia gas dissolved therein. Further, the method includes adjusting a flow rate of the ultrapure water using a control unit in fluid communication with the pressure sensor such that the operational pressure of the contactor remains below atmospheric pressure. The method also includes removing a residual transfer gas out of the contactor using a compressor in fluid communication with the contactor. The method further includes delivering the rinsing liquid at an outlet using a pump in fluid communication between the contactor and the outlet. The rinsing liquid having a gaseous partial pressure below the atmospheric pressure.

The technology, in another aspect, features a system for supplying a rinsing liquid. The system includes a rinsing liquid source in fluid communication with a membrane contactor. The rinsing liquid source is configured to supply a rinsing liquid having a first concentration of oxygen. The system further includes a nitrogen gas source in fluid communication with the membrane contactor. The nitrogen source is configured to supply nitrogen gas to the membrane contactor. The system also includes a nozzle in fluid communication with the membrane contactor. The nozzle is configured to adjust a flow rate of the nitrogen gas. Further, the system includes a membrane contactor configured to generate a stripped rinsing liquid from the rinsing liquid. The stripped rinsing liquid having a second concentration of oxygen that is less than the first concentration of oxygen.

The technology can further include any of the following features. In some embodiments, the system further includes a pump in fluid communication between the membrane contactor and an outlet. The pump can be configured to deliver the stripped rinsing liquid at the outlet. In some embodiments, the pump is a vacuum pump. For example, in some embodiments, the pump is one of a chemically inert diaphragm pump or a water ring pump.

BRIEF DESCRIPTION OF THE DRAWINGS

The advantages of the systems and methods described herein, together with further advantages, may be better understood by referring to the following description taken in conjunction with the accompanying drawings. The drawings are not necessarily to scale, emphasis instead generally being placed upon illustrating the principles of the described embodiments by way of example only.

DETAILED DESCRIPTION

In some aspects, the systems and methods described herein can include one or more mechanisms or methods for generating and delivering a rinsing liquid comprising DI-water with a desired concentration of NH3 dissolved therein with a gaseous partial pressure below the atmospheric pressure. The systems and methods described herein can include one or more mechanisms or methods for reducing and/or removing dissolved oxygen from rinsing liquids. The systems and methods described herein can include one or more mechanisms or methods for precise control of the gaseous partial pressure by controlling the carrier gas flow. The systems and methods described herein can include one or more mechanisms or methods for an oxygen reduction system that reduces the oxygen content in the rinsing liquid while mitigating any ammonia stripping.

Figure 1:
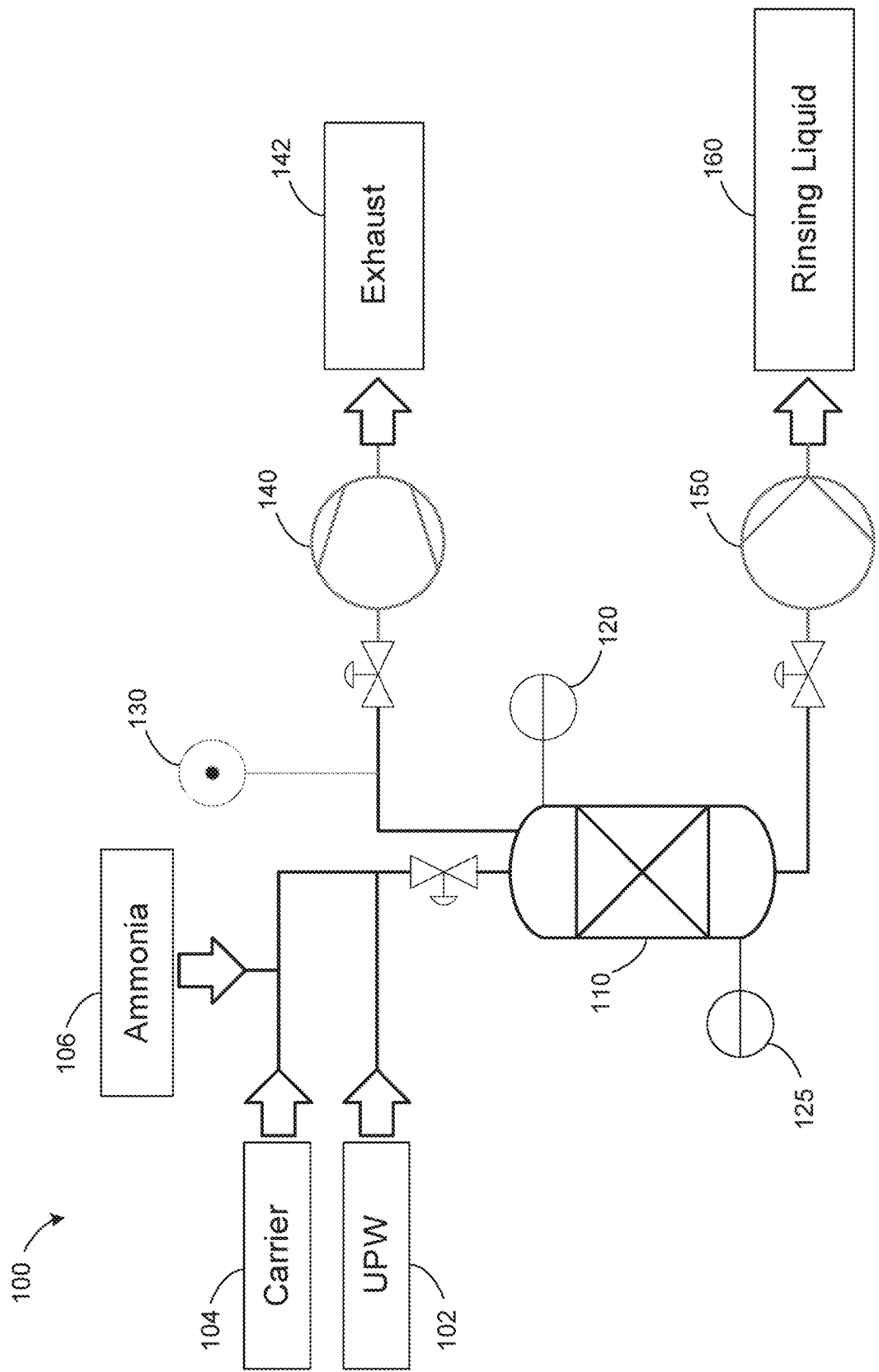
FIG. 1 is a block diagram of an exemplary system for supplying a rinsing liquid comprising DI-water with a desired concentration of NH3 dissolved therein with a gaseous partial pressure below the atmospheric pressure, according to embodiments of the technology described herein.

FIG. 1 is a block diagram of an exemplary system 100 for supplying a rinsing liquid comprising DI-water with a desired concentration of NH3 dissolved therein with a gaseous partial pressure below the atmospheric pressure. The system 100 includes at least one ultrapure water source 102, at least one carrier gas source 104, and at least one ammonia gas source 106. Optionally, in some embodiments, the carrier gas source 104 and ammonia gas source 106 comprise a gas mixture source. The carrier gas 104 and ammonia gas 106 may be added to the ultrapure water 102 before it enters contactor 110, although those skilled in the art will appreciate that the carrier gas 104 and/or ammonia gas 106 may be added to the ultrapure water anywhere within the system 100. In some embodiments, contactor 110 is a packed column or packed tower type contactor. Optionally, any variety, number, or type of contactors 110 may be used.

Contactor 110 is operated at a pressure below the atmospheric pressure. The operating pressure inside of contactor 110 is monitored by at least one pressure sensor 120. Pressure sensor 120 is connected to a control unit (not shown) that adjusts the operation variables such as the flow rate of the ultrapure water 102. As such, the pressure sensor 120 may be configured at the inlet in order to maintain the operation pressure, although those skilled in the art will appreciate that the pressure sensor 120 may be configured at other locations of contactor 110. The system 100 includes at least one compressor 140 which may be configured to remove residual transfer gas from the contactor 110 at the exhaust 142. In one embodiment, system 100 includes level sensor 125 which may be configured to monitor the liquid level within contactor 110.

System 100 includes at least one pump 150. In one embodiment, the pump 150 may be configured to deliver the rinsing liquid 160 at the required pressure to the wafer or panel treatment machine. In some embodiments, pump 150 may comprise a centrifugal pump. For example, pump 150 may be selectively operable and configured not to operate if the pump 150 is not sufficiently filled with at least one of the carrier gas, ammonia gas, residual gas, ultrapure water, and/or rinsing liquid. During startup of system 100, for example, pump 150 may not be filled with liquid. Accordingly, contactor 110 can be pressurized temporarily during the startup procedure in order to allow some water flow out of the contactor 110 into pump 150. The startup phase ends when the contactor 110 has the required liquid level and a minimal liquid flow is achieved.

The pressure inside of contactor 110 can be controlled by adjusting the water flow into the contactor. In some embodiments, the controlled pressure inside of contactor 110 is in the range of from about 0.4 to about 0.95 bar absolute, although those skilled in the art will appreciate that the contactor 110 may be operated at any variety of pressures. In some embodiments, the controlled pressure inside of contactor 110 is 0.6 bar absolute. In some embodiments, the carrier gas 104 is nitrogen ("N2") gas. Optionally, any variety of alternate gases may be used.

The lower limit of the pressure inside contactor 110 is dictated by the operation of pump 150, which pressurizes the liquid to supply pressure. A low pressure causes cavitation inside of pump 150. It is desirable to avoid this cavitation as it can lead to particles in the liquid. Particles are unwanted in semiconductor processes as they can contaminate and damage structures formed on a wafer during fabrication. In some embodiments, pump 150 is a bearingless pump operated based on the principles of magnetic levitation. This type of pump has a very low pressure at which cavitation does onset. Such a pump can be advantageous for this application. In one example, pump 150 is a Levitronix BPS 2000 pump system.

In some embodiments, pump 150 can introduce heat into the outflowing liquid. This can have a larger impact on the operation of system 100 at low liquid flow rates where the temperature can be significantly higher downstream of pump 150. The change in liquid temperature can cause a change in the conductivity in the liquid.

In some embodiments, the temperature increase due to the pumping action of pump 150 is used as feedback to a controller which adjusts the NH3 feed rate accordingly in order to achieve a constant conductivity. In some embodiments, a heat exchanger is used to control the temperature of the outflowing liquid, where the cooling flow is temperature controlled. In some embodiments, a Peltier element is used to control the temperature of the outflowing liquid.

Operating with a very low pressure inside of contactor 110 can have drawbacks. For example, a higher pump energy is needed, causing higher costs and a temperature increase at low flow rates.

The upper limit of the pressure inside of contactor 110 is given by the partial pressure exerted by the carrier gas 104 that can cause bubble generation as the liquid is dispensed on the wafer in the single wafer treatment tool. One key factor causing the generation of bubbles is the partial pressure of the dissolved gases in the liquid. Bubbles nucleation in a liquid can occur when the gaseous partial pressure is higher than the static liquid pressure. The bubble nucleation can occur at a particle as bubble nuclei. The particle concentration in ultrapure water is low, so that this mechanism may be inhibited.

Another mechanism that can cause generation of bubbles is the fluctuation of the liquid flow, for example, in a turbulent flow. This can generate local conditions of very low liquid pressure for short periods, which are low enough to cause spontaneous bubble nucleation.

Further, the shape of the nozzle can cause generation of bubbles. A smooth nozzle may not cause bubbles in a rinsing liquid having a carrier gas partial pressure less than or equal to ambient pressure. However, using a sharp nozzle may cause bubbles to be generated at lower partial pressure of the dissolved carrier gas.

Figure 2:
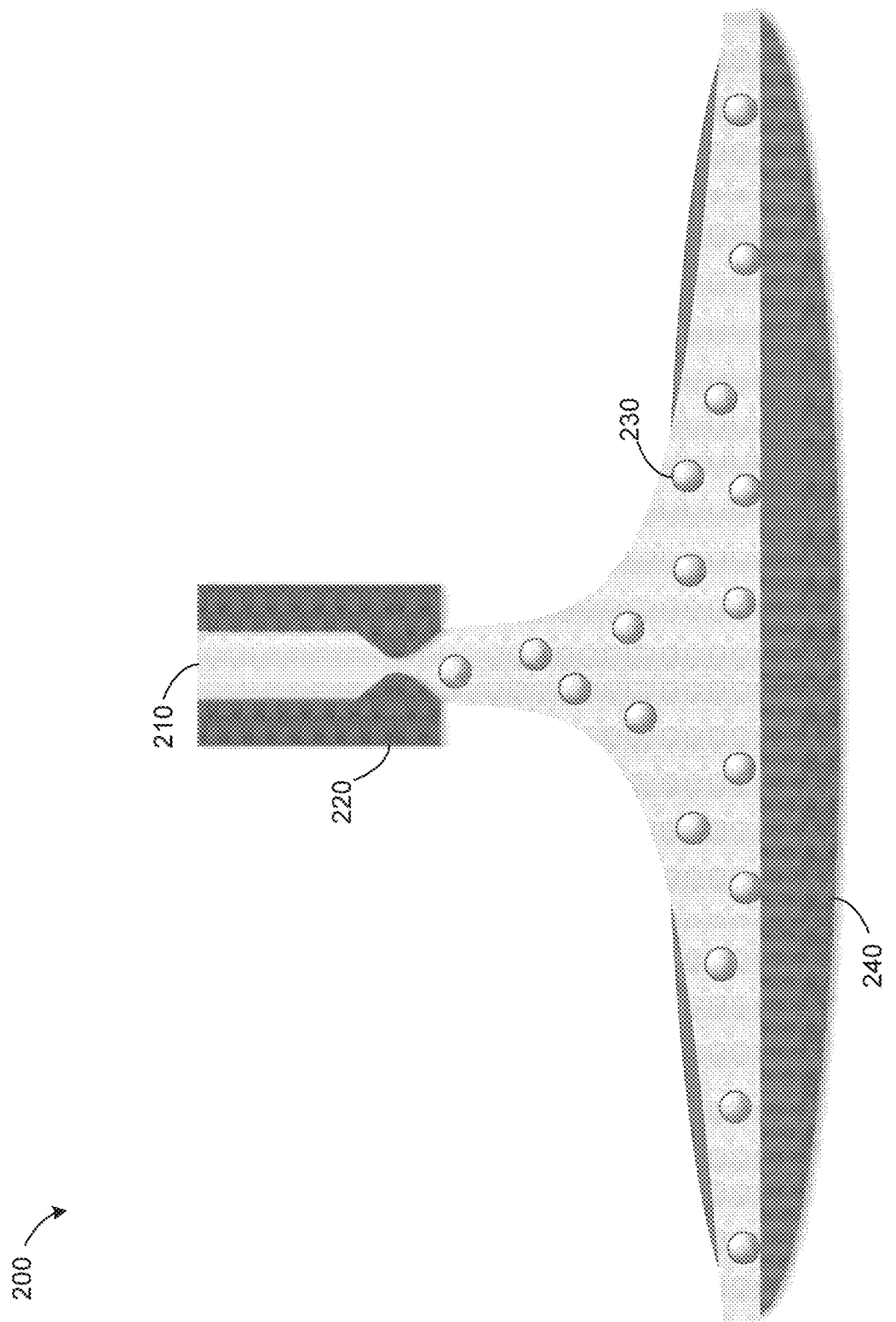
FIG. 2 is a diagram illustrating bubble generation caused by rinsing liquid being dispensed on a wafer from a dispensing nozzle, according to embodiments of the technology described herein.

Contactor 110 needs a pressure below the desired partial pressure exerted by the carrier gas in the liquid, in order to be able to remove the carrier gas out of the liquid. Further, the technology described herein can avoid the generation of bubbles at the liquid dispenser by supplying a liquid with a low gaseous partial pressure. FIG. 2, discussed below, is a diagram 200 illustrating bubble generation caused by rinsing liquid being dispensed on a wafer from a dispensing nozzle. A pressure of about 0.95 bar absolute can avoid bubbles at the dispense nozzle under substantially optimal conditions. In one embodiment, a pressure inside of contactor 110 of 0.6 bar allows stable operation even under unfavorable conditions. The generation of bubbles can be further lowered by choosing a geometry for the dispenser that avoids sharp gradients in the liquid flow velocity. A setup for understanding and mitigating bubble generation in a rinsing liquid is described below in connection with FIG. 3.

The flow of the carrier gas (e.g., N2) through the system 100 can have certain constraints. For example, a high flow rate of carrier gas 104 increases the amount of NH3 stripped into the exhaust 142, which is unwanted. Further, a high flow rate of carrier gas 104 requires that compressor 140 uses a pump having a bigger diaphragm, which adds unwanted cost. Moreover, the gas inside of contactor 110 is, due to its working principle, more or less saturated with water vapor. An increase of the pressure of such gas increases the pressure of the water vapor above the saturation pressure, which results in condensing of water.

Certain types of compressors need oil for lubrication, which causes oil contamination in the outflowing gas. Such oil contamination is unwanted. Therefore, in some embodiments, an oil-free diaphragm pump is used for compressor 140 to compress the exhaust gas. Diaphragm pumps are robust devices which are available for corrosive gases and tolerate humid gas.

The exhaust gas flow contains water droplets at the outlet of compressor 140 which are unwanted. In some embodiments, the exhaust gas 142 is diluted with dry gas. The dry gas can be added between nozzle 130 and compressor 140 or downstream of compressor 140. The amount of added dry gas can be chosen to achieve a relative humidity in the compressed exhaust gas below 100%.

In other embodiments, the exhaust gas is heated by a heat exchanger or by a heated tubing to an amount such that the relative humidity is below 100% at the achieved temperature.

The carrier gas 104 acts to transfer the NH3 106 into the contactor 110. Generally, a time delay arises as a function of the length of the corresponding gas piping. A large time delay is unwanted, as it impacts the stability of the concentration of dissolved NH3 in the liquid in the case of dynamically-changing liquid flow rates. A fast system reaction is needed when liquid flow rates change dynamically to avoid NH3 concentration overshoot or undershoot in the resulting rinsing liquid. A pressure increase drives DI-water into the gas line. This is unwanted as NH3 gas is so reactive with DI-water that there is a high risk the DI-water will flow back into the NH3 gas supply line and into the NH3 valves when the flow rate of NH3 is sufficiently low. Some reaction time is therefore needed to detect this case and close corresponding valves.

In some embodiments, the carrier gas flow rate is set between 1 slm and 20 slm. In some embodiments, the flow rate of the carrier gas is 2 slm at a pressure of 0.6 bar absolute in contactor 110.

Using the system and techniques described above, the partial pressure exerted by the carrier gas in the dispensed rinsing liquid 160 can be below the ambient pressure. In some embodiments, system 100 can supply the demand of rinsing liquid 160 for a typical single wafer tool or other tools that rinse surfaces for example of flat panels. The flow rate of the rinsing liquid 160 can range between 0.5 liters per minute to 100 liters per minute. In certain embodiments at least a second DI-water flow is mixed to the flow through contactor 110, in order to achieve a higher liquid outlet flow of up to 140 liters per minute.

Referring to FIG. 2, a diagram 200 illustrates bubble generation 230 caused by rinsing liquid 210 being dispensed on a wafer 240 from a dispensing nozzle 220. As mentioned above, a single wafer tool can use several chambers. A single dispensing nozzle 220 can be used to supply liquid to the wafer 240 each chamber. In some embodiments, the dispensed flow in each chamber may be independent of the actual number of chambers using the rinsing liquid 210. This can typically be achieved by a pressure drop in the dispense nozzle 220 or an upstream valve that is larger than the pressure drop of the flowing liquid in the liquid distributing tubing.

Figure 3:
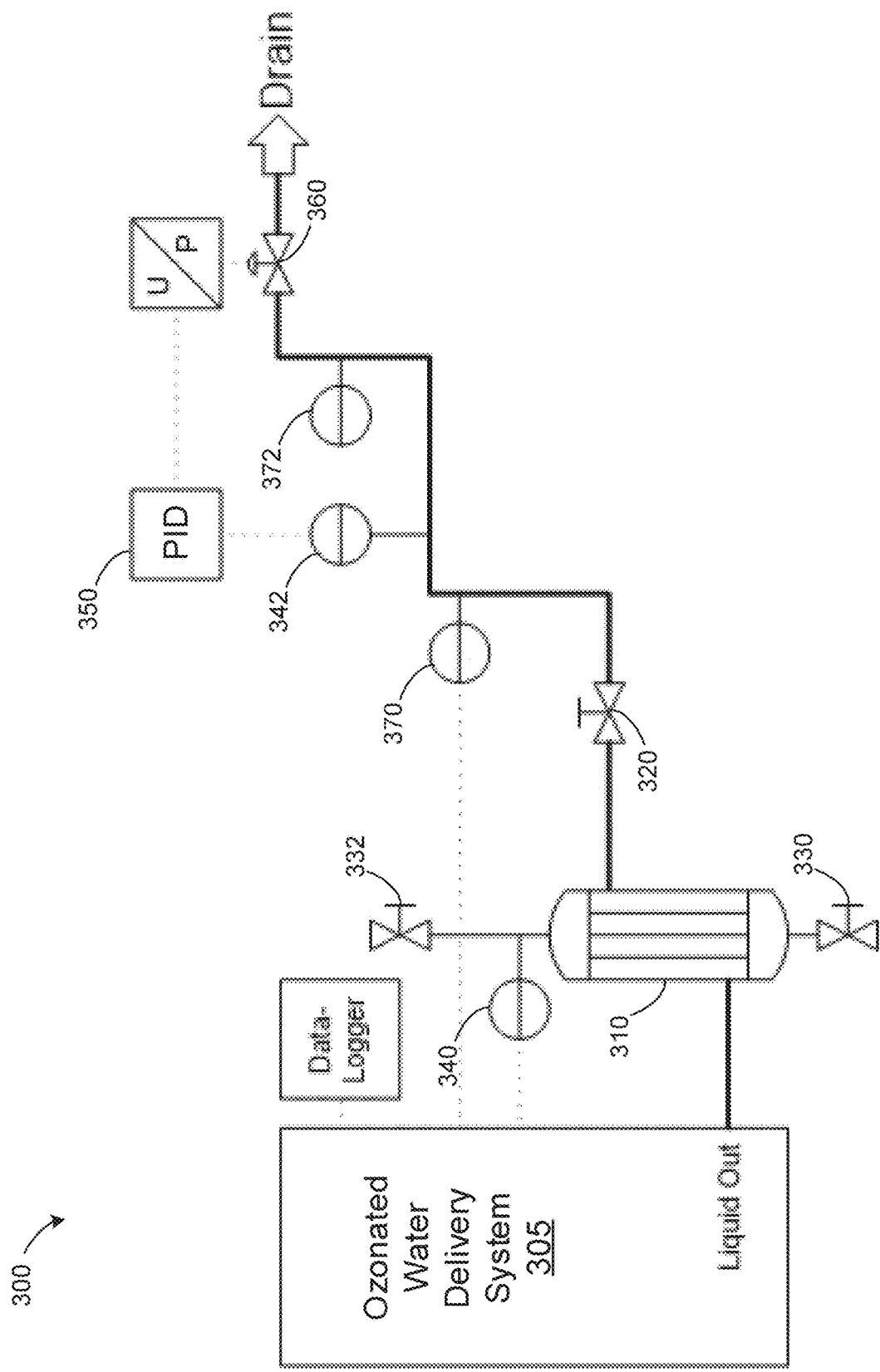
FIG. 3 is a block diagram of an exemplary system for understanding and mitigating bubble generation in a rinsing liquid, according to embodiments of the technology described herein.

FIG. 3 is a block diagram of a system 300 for understanding and mitigating bubble generation in a rinsing liquid. A liquid having oxygen dissolved therein is created using ozonated water delivery system 305 and supplied at Liquid Out as DIO3. In some embodiments, the ozonated water delivery system 305 is a LIQUOZON device from MKS Instruments, Inc. operating without ozone production, although alternate ozonated water delivery systems may be used.

The liquid flows through a porous membrane device 310 and is then supplied to the device under test 320. The gas inside of membrane device 310 is enclosed between valves 330 and 332. The gas pressure equalizes over time with the gaseous partial pressure of the liquid flowing through the membrane device 310. Manometer 340 is used measure the partial pressure of the liquid directly.

The pressure downstream of device under test 320 is held constant by a control loop consisting of manometer 342, PID-Controller 350, and flow adjustment valve 360. The bubble content in the liquid is measured with the two devices 370 and 372. In the illustrated embodiment, the two devices 370 and 372 comprise optical measuring devices although any variety of devices may be used.

Figure 4:
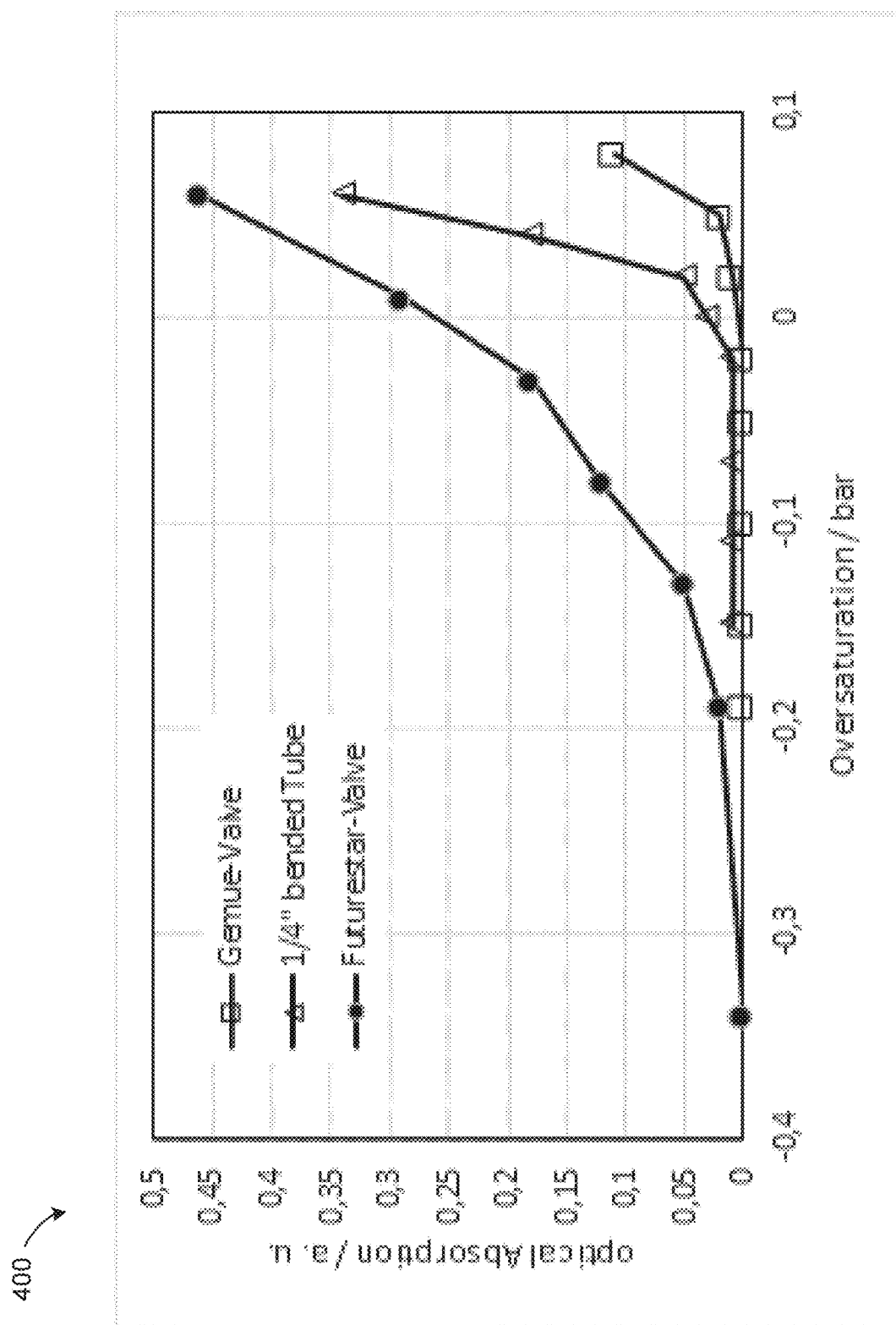
FIG. 4 is a graph showing the results using three different designs of a device under test that were characterized using a system according to embodiments of the technology described herein.

FIG. 4 is a graph showing the results using three different designs of device under test 320 that were characterized using system 300: (1) a smooth membrane valve from Gemü Group, (2) a valve with sharp edges from Futurestar Corporation, and (3) a bent tube having an outer diameter of about 0.25 inches (6.35 mm) and an inner diameter of about 0.15 inches (3.95 mm).

For the characterization, the valves 330 and 332 were adjusted to have the same flow rate at a defined pressure drop. The length of the tubing was chosen to have nearly the same flow rate at this pressure drop. Referring to the results in FIG. 4, oversaturation is defined as the difference in measured pressure, i.e., the pressure measured by manometer 342 minus the pressure measured by manometer 340. A positive oversaturation means the gaseous partial pressure is higher than the liquid pressure. A negative oversaturation means that the liquid pressure is higher than the gaseous partial pressure.

Figure 5:
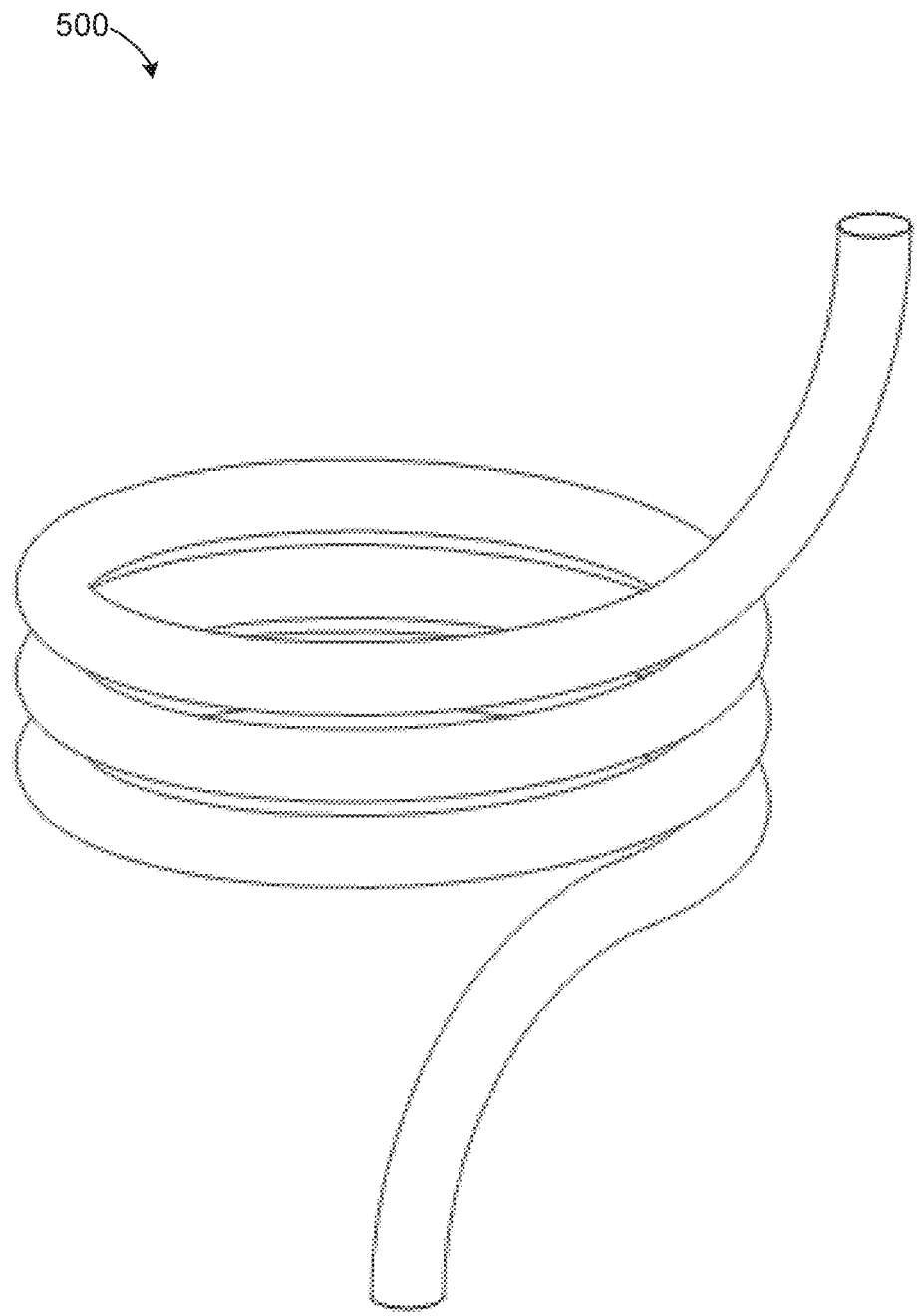
FIG. 5 shows an exemplary tube formed into a helical shape, according to embodiments of the technology described herein.

The bubble content of the liquid flowing from device under test 320 was measured optically with device 370. As shown, the bent tube and the smooth membrane valve from Gemü Group generate the fewest amount of bubbles. In some embodiments, a membrane value is used to set the pressure drop. Optionally, a tube formed into a helical shape is used to set the pressure drop. FIG. 5 shows an exemplary tube 500 formed into a helical shape. The pressure drop can be achieved by choosing the right number of turns and the right diameter of the helix.

As fabrication processes have evolved and the feature geometries have continued to increase and complexity and decrease in size, the rinsing of wafers with exposed metal layers has become a substantially more demanding and precise process. Rinsing of silicon wafers is often combined with oxidizing the surface, as this makes the surface less sensitive against contamination. The rinsing of metals on the other side of the wafer has to avoid oxidation of the surface, as this can cause corrosion and etching of metal in the rinsing liquid, which is unwanted.

The technology described herein lowers the oxygen content of a rinsing liquid. The sources for oxygen contamination of the rinsing liquid were analyzed. Two sources of oxygen contamination caused during the rinsing process are the rinsing liquid itself, and the effects of the flow of the rinsing liquid over the wafer.

A main source of oxygen in the rinsing liquid is oxygen in the liquid chemicals that make up the rinsing liquid. Liquid chemicals are often stored in plastic vessels to avoid metal contamination. The plastic vessels allow oxygen to permeate into the liquid while in storage. As such, the liquid chemical may become saturated with atmospheric oxygen over time. This source of oxygen in the rinsing liquid is avoided in the system described herein as no liquid chemicals are used in the creation of the rinsing liquid. For example, the system described herein uses clean gases and ultrapure water. Gases are handled in metallic vessels and pipes that are not penetrated by atmospheric oxygen.

Generally, ultrapure water ("UPW") is the liquid with the lowest oxygen concentration available in a semiconductor fabrication facility. UPW is generally prepared shortly before use and the oxygen is removed before the UPW is distributed to the various processing tools in the semiconductor fabrication facility.

Given these factors and conditions, the remaining source for oxygen contamination is the oxygen permeation into the pipes and tubes used to handle and distribute the rinsing liquids. Accordingly, these sources for the oxygen contamination sources have been characterized.

Oxygen permeation into plastic pipes and tubes occurs according to a known process. In one embodiment, tubes made from perfluoroalkoxy ("PFA") may be used. This material is selected due to the aggressive and highly-reactive liquids used in the semiconductor manufacturing processes due to its high inertness. PFA is compatible with most chemicals and can be used at higher temperatures. Tubes and fittings formed from this material are readily available. However, PFA has the drawback of comparatively-high permeation coefficients for gases. Optionally, tubes may be manufactured from any variety of materials offering high inertness and availability.

The UPW distribution piping in a semiconductor fabrication facility is typically made from polyvinylidene fluoride ("PVDF"). PVDF has a much lower oxygen permeation coefficient than PFA. Therefore, the UPW itself maintains its low oxygen content throughout the distribution piping with the exception of the last line which is used to connect to the semiconductor manufacturing tools. This connection is often made from PFA due to its greater flexibility. It has a higher ratio of tube surface-to-liquid flow than the main distribution piping formed from PVDF.

These lines may also have a stagnant flow, in case of tool maintenance or shutdown. The result of this analysis is that the overall contribution to oxygen contamination of the small diameter PFA tubes has a measurable effect. The technology described herein therefore uses a nitrogen-purged double containment for the PFA inlet and outlet tubing of the NH3 dissolution device. This configuration is effective in avoiding oxygen permeation into the rinsing liquid and needs only a moderate effort to implement and realize.

A further reduction of the oxygen content can be achieved by combining oxygen removal with the NH3 dissolution system 100.

Figure 6:
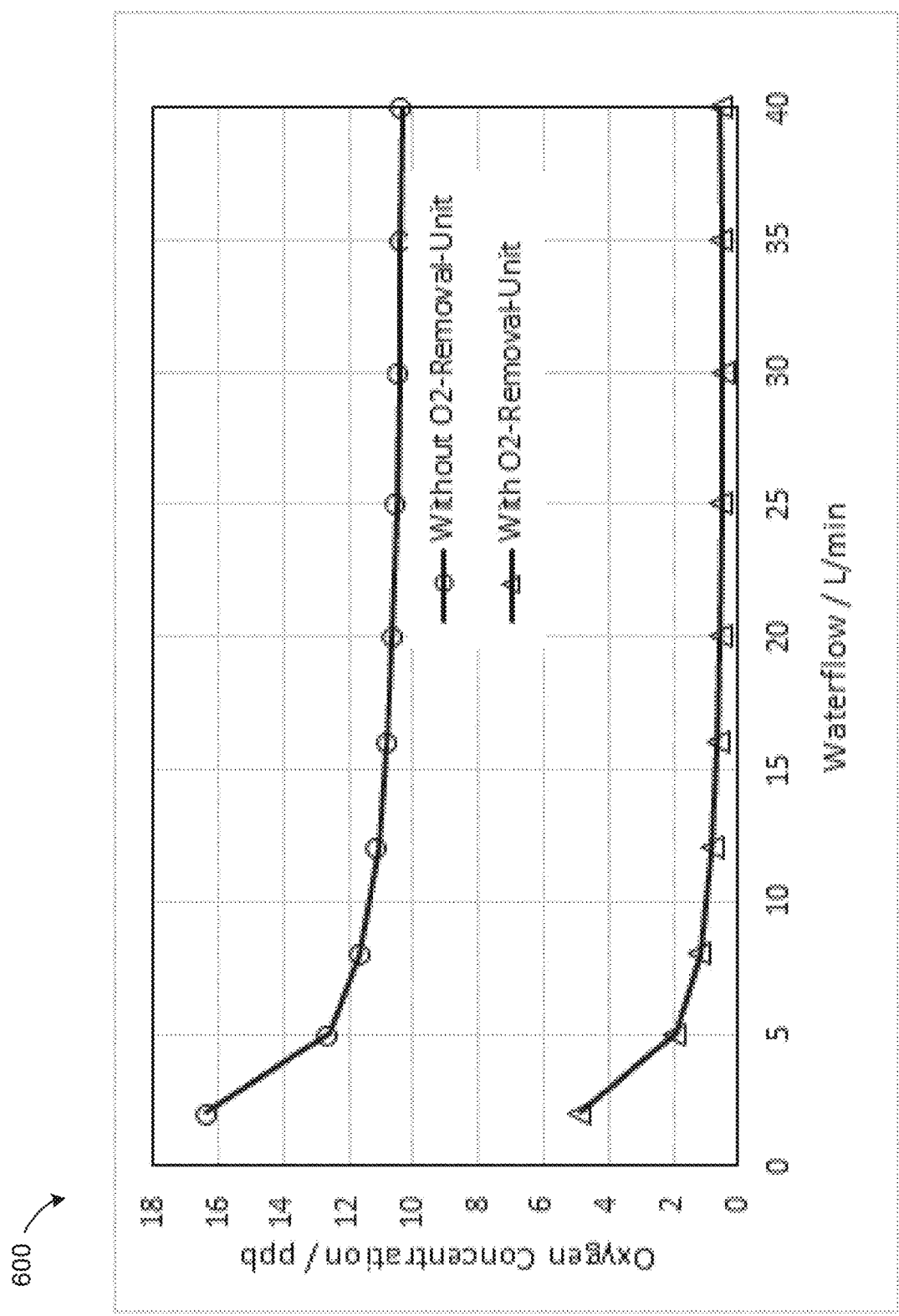
FIG. 6 is a graph showing a comparison of the oxygen concentration at the outlet of an apparatus for generating and delivering a conductive cleaning liquid comprising DI-water with a desired concentration of NH3 dissolved therein with and without using an oxygen removal unit, according to embodiments of the technology described herein.

FIG. 6 is a graph showing a comparison of the oxygen concentration at the outlet of an apparatus for generating and delivering a conductive cleaning liquid comprising DI-water with a desired concentration of NH3 dissolved therein (such as the apparatus described in U.S. patent application Ser. No. 15/808,471) with and without using an oxygen removal unit.

In some embodiments, the oxygen removal unit is a commercial available membrane contactor type 3M™ Liqui-Cel™ EXF-4×28 Series, although any variety and number of oxygen removal units may be used. It can be operated with a N2 gas flow of 28 slm at ambient gas pressure. The N2 quality can be substantially grade 5.6.

Figure 7:
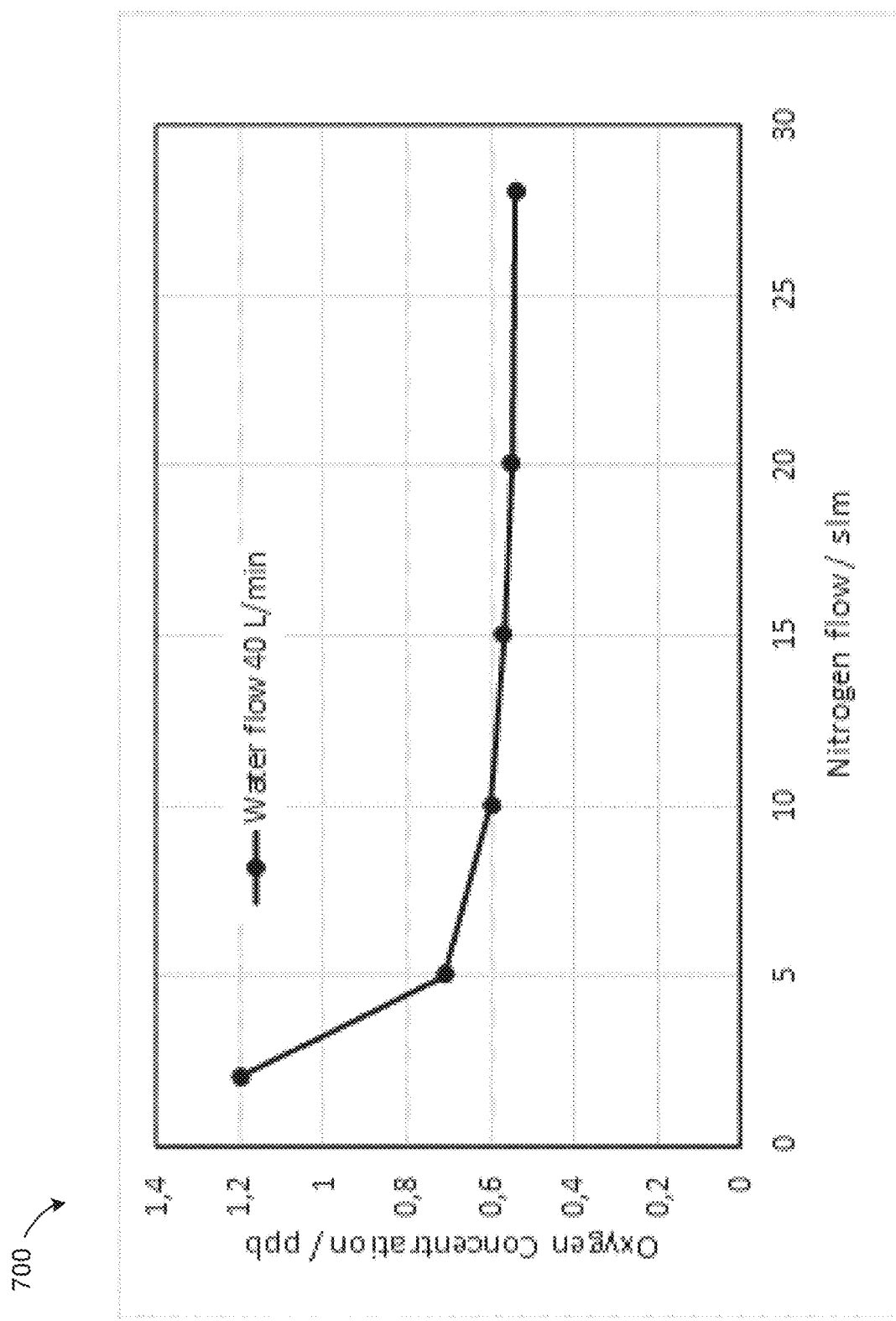
FIG. 7 is a graph showing the influence of the N2 gas flow on the oxygen concentration in the outlet, according to embodiments of the technology described herein.

The oxygen removal capacity of such a module is high enough to be effective for some processes. However, oxygen removal capacity can be enhanced if the oxygen removal capacity is also operated with a lower N2 gas flow. FIG. 7 is a graph showing the influence of the N2 gas flow on the oxygen concentration in the outlet. It is not necessary to operate the membrane contactor at a vacuum pressure. This would add additional undesired cost for a vacuum pump.

The membrane contactor is chosen such that it has a low pressure drop for the liquid flow and is chemically compatible with the NH3 solution. A low pressure drop for the liquid flow is important as it avoids energy input into the liquid due to pumping action of the pump. Requiring high energy for pumping causes temperature changes of the liquid which is unwanted.

Figure 8:
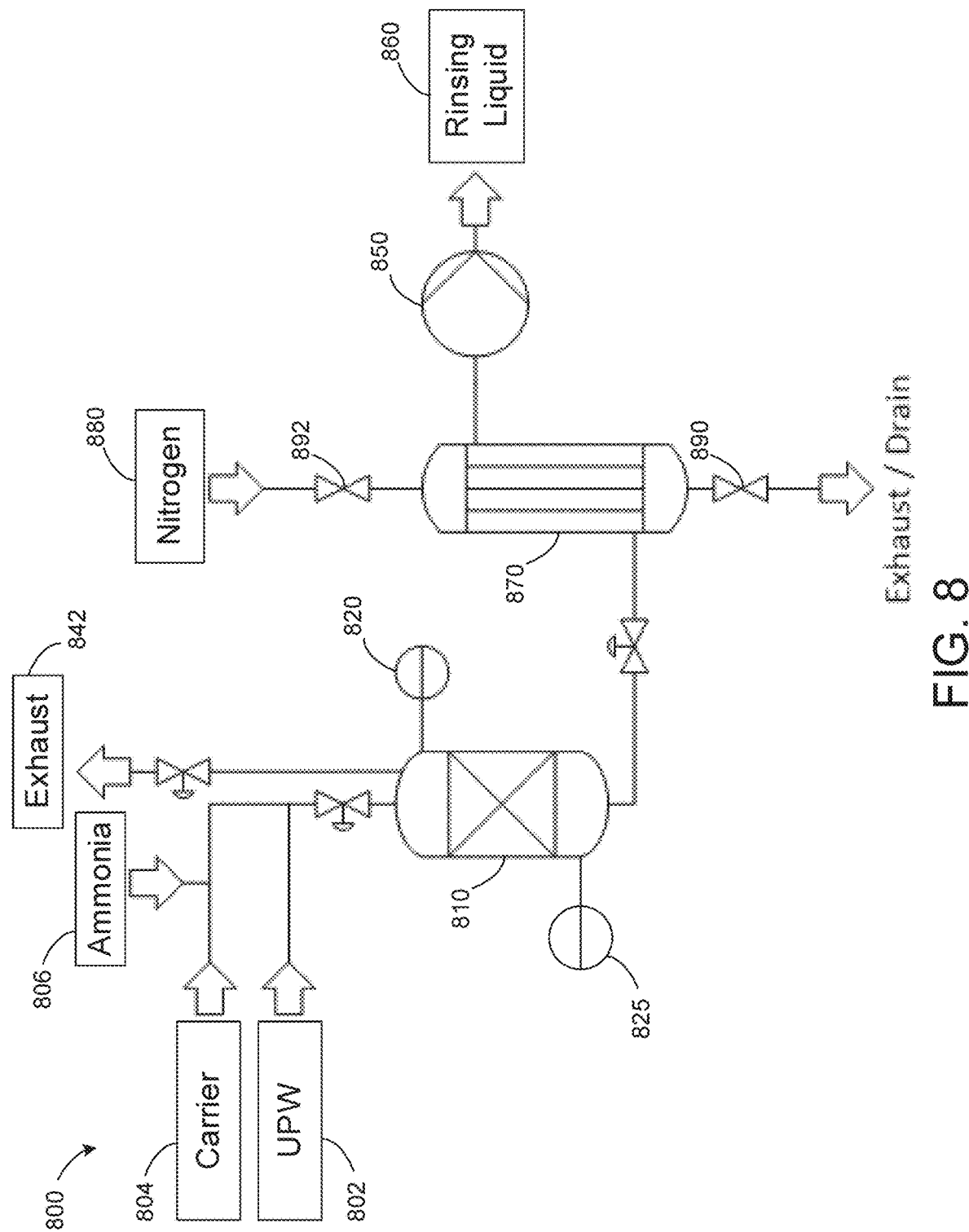
FIG. 8 is a block diagram of an exemplary system for supplying a rinsing liquid comprising DI-water with a desired concentration of NH3 dissolved therein with reduced oxygen content, according to embodiments of the technology described herein.

FIG. 8 is a block diagram of an exemplary system 800 for supplying a rinsing liquid 860 comprising DI-water with a desired concentration of NH3 dissolved therein with reduced oxygen content. Similar to system 100, system 800 includes ultrapure water source 802, carrier gas source 804, ammonia gas source 806, contactor 810, pressure sensor 820, level sensor 825 and exhaust 842. System 800 includes membrane contactor 870 in combination with a NH3 dissolution system such as system 100, described above in relation to FIG. 1. System 800 also includes a nitrogen gas source 880 and pump 850.

In order to avoid a humid off gas from membrane contactor 870, the membrane contactor 870 can be operated at a pressure above ambient pressure. The N2 flow rate from the nitrogen gas source 880 can be adjusted by two fixed nozzles, 890 and 892. The inner diameter of the nozzles 890 and 892 are chosen such that the N2 pressure in contactor 810 is above ambient pressure and below the liquid pressure in contactor 810. The expansion of the N2 gas at nozzle 890 reduces the relative humidity in the N2 below the saturation point and avoids liquid water at the gas outlet of the membrane contactor 870.

In some cases, it may be preferable to have a gaseous partial pressure in the rinsing liquid 860 below the ambient pressure. The membrane contactor 870 can accordingly be operated with a N2 pressure below ambient pressure and a vacuum pump 850 can be used in the gas outlet of membrane contactor 870. The vacuum pump 850 may be a chemically inert diaphragm pump or a water ring pump.

As discussed above, the solubility of NH3 is high compared to that of other dissolved gases. The stripping effect of NH3 in the membrane contactor 870 is therefore surprisingly low. The N2 flow rate can be adjusted to give an NH3 loss below 1% while retaining a sufficiently high removal rate of oxygen.

Figure 9:
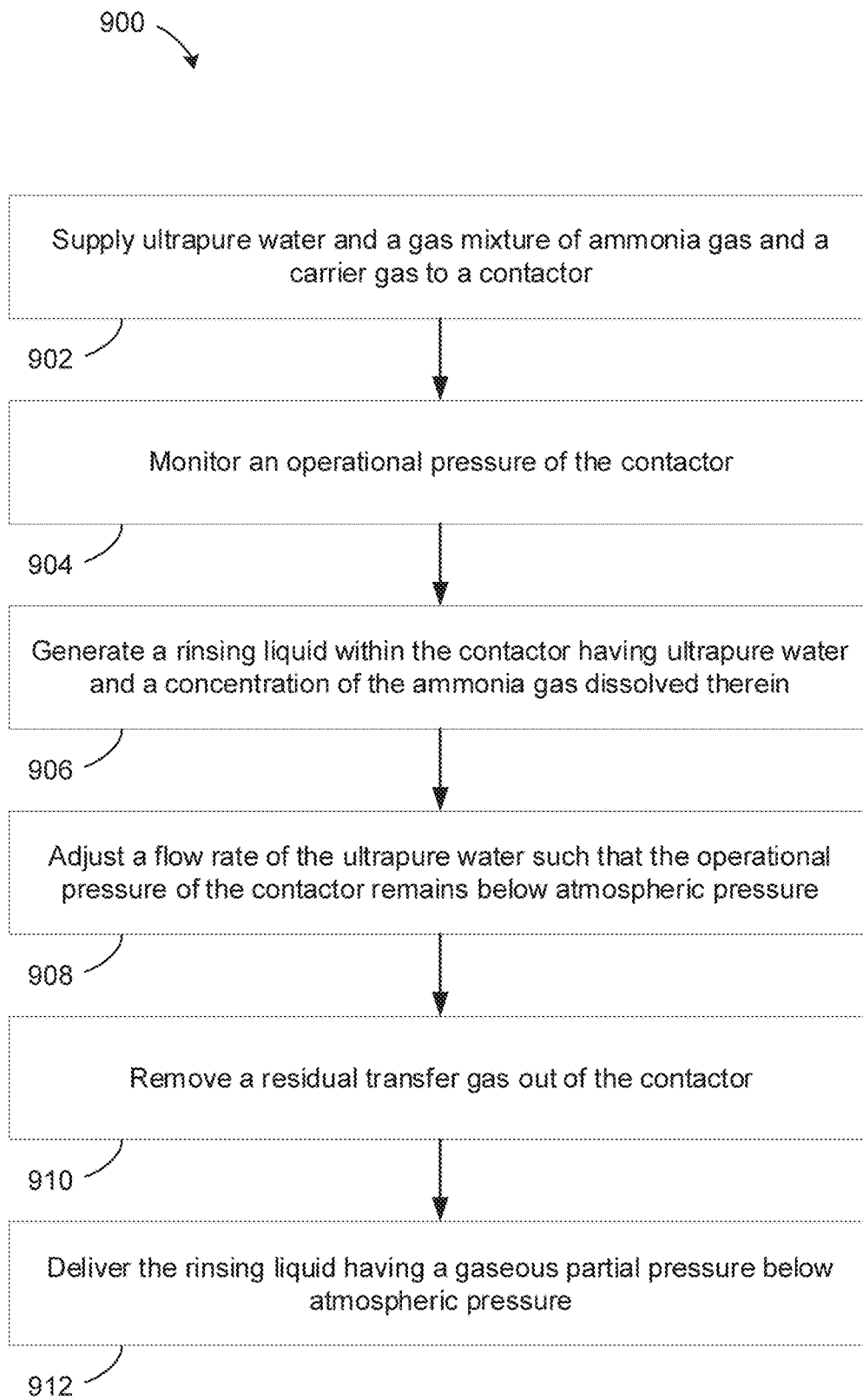
FIG. 9 is a flow diagram of a method 900 for supplying a rinsing liquid comprising DI-water with a desired concentration of NH3 dissolved therein, according to embodiments of the technology described herein.

FIG. 9 is a flow diagram of a method 900 for supplying a rinsing liquid comprising ultrapure water with a desired concentration of an ammonia gas dissolved therein having a gaseous partial pressure below atmospheric pressure, according to embodiments of the technology described herein. Ultrapure water and a gas mixture can be supplied (902) to a contactor. In some embodiments, the contactor is a packed column or packed tower type contactor.

As described above in relation to FIG. 1, the gas mixture includes ammonia gas and a carrier gas. For example, using system 100, the ultrapure water source 102 can supply ultrapure water to the contactor 110, the carrier gas source 104 can supply a carrier gas to the contactor 110, and the ammonia gas source 106 can supply ammonia gas to the contactor 110. In some embodiments, the ultrapure water, the ammonia gas, and the carrier gas are mixed prior to entering the contactor.

An operational pressure of the contactor can be monitored (904) using a pressure sensor in fluid communication with the contactor. For example, using system 100, the operational pressure of the contactor 110 can be monitored using the pressure sensor 120.

A rinsing liquid can be generated (906) within the contactor. As described above in relation to FIG. 1, the rinsing liquid includes ultrapure water and a concentration of the ammonia gas dissolved therein. For example, using system 100, rinsing liquid 160 can be generated within contactor 110.

The flow rate of the ultrapure water can be adjusted (908) using a control unit in fluid communication with the pressure sensor. As described above in relation to FIG. 1, the flow rate of the ultrapure water can be adjusted such that the operational pressure of the contactor remains below atmospheric pressure. For example, using system 100, the flow rate of the ultrapure water supplied by the ultrapure water source 102 can be adjusted using the control unit in fluid communication with the pressure sensor 120. In some embodiments, the control unit is configured to adjust the flow rate of the ultrapure water at an inlet of the contactor 110. In some embodiments, the operational pressure of the contactor 110 is controlled by adjusting a flow rate of the carrier gas. In other embodiments, the operational pressure of the contactor 110 is controlled by adjusting a flow rate of the residual transfer gas.

In some embodiments, the operational pressure of the contactor 110 is a pressure ranging from about 0.4 to about 0.95 bar absolute. For example, in some embodiments, the operational pressure of the contactor is a pressure of about 0.6 bar absolute.

A residual transfer gas can be removed (910) out of the contactor using a compressor in fluid communication with the contactor. For example, using system 100, the residual transfer gas can be removed out of contactor 110 using the compressor 140.

The rinsing liquid can then be delivered (912) at an outlet using a pump in fluid communication between the contactor and the outlet. As discussed above, the rinsing liquid has a gaseous partial pressure below the atmospheric pressure. For example, using system 100, the rinsing liquid 160 can be delivered at an outlet using pump 150.

In some embodiments, the rinsing liquid 160 is delivered to a wafer. For example, in some embodiments, a dispensing nozzle 220 in fluid communication to the outlet is configured to deliver the rinsing liquid 210 to a wafer 240.

In some embodiments, using system 800, a membrane contactor 870 in fluid communication with the outlet is configured to strip oxygen from the rinsing liquid 860. For example, in some embodiments, the system 800 for supplying a stripped rinsing liquid 860 can include a rinsing liquid source in fluid communication with a membrane contactor 870. The rinsing liquid source can be configured to supply a rinsing liquid having a first concentration of oxygen. In some embodiments, the system 800 can include a nitrogen gas source 880 in fluid communication with the membrane contactor 870. For example, in some embodiments, the nitrogen gas source 880 can be configured to supply nitrogen gas to the membrane contactor 870. In some embodiments, the system 800 can include a nozzle 890 in fluid communication with the membrane contactor 870. For example, the nozzle 890 can be configured to adjust a flow rate of the nitrogen gas. In some embodiments, the system 800 can include two nozzles 890 and 892 that can both be configured to adjust the flow rate of the nitrogen gas. In some embodiments, the membrane contactor 870 can be configured to generate the stripped rinsing liquid 860 from the supplied rinsing liquid. As discussed above in relation to FIG. 8, the stripped rinsing liquid 860 has a second concentration of oxygen that is less than the first concentration of oxygen.

As described in detail above, apparatuses such as the one described in U.S. patent application Ser. No. 15/808,471 can supply a very dilute ammonia solution for use in fabrication rinsing processes. The solution can be prepared by directly dissolving ammonia gas into water. Ammonia gas is diluted with nitrogen gas to avoid the ammonia fountain effect inside of the apparatus. The ammonia fountain effect occurs when water and ammonia gas are brought into contact, the water absorbs ammonia, and a vacuum is created. The additional dissolved nitrogen and oxygen gas traces are non-negligible and can affect fabrication processes. For example, the dissolved nitrogen can cause microbubbles at the wafer surface, which can cause defects at the structures on the wafer, and the oxygen traces in the liquid can corrode metals. The systems and methods described in detail above address these concerns through precise control of the gaseous partial pressure of the rinsing liquid and stripping of oxygen content from the rinsing liquid prior to application on the wafer.

Variations, modifications, and other implementations of what is described herein will occur to those of ordinary skill in the art without departing from the spirit and the scope of the invention. Accordingly, the invention is not to be limited only to the preceding illustrative descriptions.

What is claimed is:

1. A system for supplying a rinsing liquid comprising ultrapure water and an ammonia gas, the system comprising:
   an ultrapure water source in fluid communication with a contactor, wherein the ultrapure water source is configured to supply ultrapure water to the contactor;

a gas mixture source in fluid communication with the contactor, wherein the gas mixture source is configured to supply the ammonia gas and a carrier gas to the contactor;

a control unit in fluid communication with the contactor, wherein the control unit is configured to adjust a flow rate of the ultrapure water such that an operational pressure of the contactor remains below a pressure threshold;

a compressor in fluid communication with the contactor, wherein the compressor is configured to remove a residual transfer gas out of the contactor;

the contactor configured to generate a rinsing liquid, wherein the rinsing liquid comprises the ultrapure water and a concentration of the ammonia gas dissolved therein; and a pump in fluid communication between the contactor and an outlet, wherein the pump is configured to deliver the rinsing liquid comprising a gaseous partial pressure below the pressure threshold at the outlet.

2. The system of claim 1, wherein the control unit is configured to adjust the flow rate of the ultrapure water at an inlet of the contactor.

3. The system of claim 1, wherein the liquid level of the contactor is controlled by adjusting a flow rate of the carrier gas.

4. The system of claim 1, wherein the liquid level of the contactor is controlled by adjusting a flow rate of the residual transfer gas.

5. The system of claim 1, wherein the operational pressure of the contactor comprises a pressure ranging from about 0.4 to about 0.95 bar absolute.

6. The system of claim 5, wherein the operational pressure of the contactor comprises a pressure of about 0.6 bar absolute.

7. The system of claim 1, wherein the pressure threshold is atmospheric pressure.

8. The system of claim 1, wherein the rinsing liquid is delivered to a wafer.

9. The system of claim 1, further comprising a nozzle in fluid communication to the outlet, wherein the nozzle is configured to deliver the rinsing liquid to a wafer.

10. The system of claim 1, further comprising a membrane contactor in fluid communication with the outlet, wherein the membrane contactor is configured to strip oxygen from the rinsing liquid.

11. The system of claim 1, further comprising a pressure sensor in fluid communication with the contactor, wherein the pressure sensor is configured to monitor the operational pressure of the contactor.

12. The system of claim 1, wherein the gas mixture source comprises an ammonia gas source and a carrier gas source, wherein the ammonia gas source is configured to supply the ammonia gas to the contactor and the carrier gas source is configured to supply the carrier gas to the contactor.

13. The system of claim 1, wherein the ultrapure water, the ammonia gas, and the carrier gas are mixed prior to entering the contactor.

14. The system of claim 1, wherein the contactor is a packed column or packed tower type contactor.

15. A method for supplying a rinsing liquid comprising ultrapure water with a desired concentration of an ammonia gas dissolved therein having a gaseous partial pressure below atmospheric pressure, the method comprising:

supplying ultrapure water and a gas mixture to a contactor, wherein the gas mixture comprises the ammonia gas and a carrier gas;

monitoring an operational pressure of the contactor using a pressure sensor in fluid communication with the contactor;

generating a rinsing liquid within the contactor, wherein the rinsing liquid comprises the ultrapure water and a concentration of the ammonia gas dissolved therein;

adjusting a flow rate of the ultrapure water using a control unit in fluid communication with the pressure sensor such that the operational pressure of the contactor remains below atmospheric pressure;

removing a residual transfer gas out of the contactor using a compressor in fluid communication with the contactor; and delivering the rinsing liquid at an outlet using a pump in fluid communication between the contactor and the outlet, wherein the rinsing liquid comprises a gaseous partial pressure below the atmospheric pressure.

16. The method of claim 15, wherein the contactor is a packed column or packed tower type contactor.

17. The system of claim 1, further comprising:

a membrane contactor in fluid communication with the outlet, the membrane contactor configured to receive the rinsing liquid comprising a first concentration of oxygen;

a nitrogen gas source in fluid communication with the membrane contactor, wherein the nitrogen gas source is configured to supply nitrogen gas to the membrane contactor;

a nozzle in fluid communication with the membrane contactor, wherein the nozzle is configured to adjust a flow rate of the nitrogen gas; and the membrane contactor configured to generate a stripped rinsing liquid from the rinsing liquid, wherein the stripped rinsing liquid comprises a second concentration of oxygen that is less than the first concentration of oxygen.

18. The system of claim 17, further comprising a pump in fluid communication between the membrane contactor and an outlet, wherein the pump is configured to deliver the stripped rinsing liquid at the outlet.

19. The system of claim 18, wherein the pump is a vacuum pump.

20. The system of claim 19, wherein the vacuum pump is one of a chemically inert diaphragm pump or a water ring pump.

* * * * *